United States Patent
Tso

[19]

[11] Patent Number: 6,157,270
[45] Date of Patent: Dec. 5, 2000

[54] PROGRAMMABLE HIGHLY TEMPERATURE AND SUPPLY INDEPENDENT OSCILLATOR

[75] Inventor: Vincent Wing Sing Tso, Milpitas, Calif.

[73] Assignee: Exar Corporation, Fremont, Calif.

[21] Appl. No.: 09/221,758

[22] Filed: Dec. 28, 1998

[51] Int. Cl.[7] .............................. H03B 5/04; H03B 5/24
[52] U.S. Cl. ..................... 331/176; 331/111; 331/143
[58] Field of Search ............................. 331/111, 143, 331/176

[56] References Cited

U.S. PATENT DOCUMENTS

| | | | |
|---|---|---|---|
| 4,621,240 | 11/1986 | Alvord et al. | 331/113 R |
| 4,717,892 | 1/1988 | Hitomi | 331/113 R |
| 4,803,445 | 2/1989 | Yamasaki | 331/177 R |
| 4,812,784 | 3/1989 | Chung et al. | 331/113 R |
| 5,317,287 | 5/1994 | Brown | 331/57 |
| 5,434,545 | 7/1995 | Burchfield | 331/143 |
| 5,440,277 | 8/1995 | Ewen et al. | 331/176 |

*Primary Examiner*—David Mis
*Attorney, Agent, or Firm*—Townsend & Townsend and Crew LLP

[57] ABSTRACT

An oscillator circuit generates an output frequency that is substantially independent of power supply and temperature variations. The oscillator circuit can be implemented using conventional complementary metal-oxide-semiconductor technology. The oscillator circuit is suitable for use as an internal oscillator for generating a stable reference frequency in telecommunication receiver modules.

15 Claims, 3 Drawing Sheets

PROGRAMMABLE HIGHLY TEMPERATURE AND SUPPLY INDEPENDENT OSCILLATOR

BACKGROUND OF THE INVENTION

The present invention relates in general to integrated circuits, and in particular to a robust oscillator circuit that is insensitive to variations in temperature and power supply voltage level.

In various types of telecommunication systems a reference frequency is commonly used as an acquisition aid in the receiver module. In those applications, such as ATM and SONET, that require reference frequencies of 35 Mhz or higher, generating a stable reference signal at such high references places a high cost and size burden on the subsystem or module. Crystal oscillators or tank circuits that are commonly used to generate the reference frequency take up additional board space and can be expensive. Thus, a receiver that does not require an externally generated reference frequency is very desirable. Internally generated reference frequencies, however, tend to be less accurate than their external counterparts. This is because on-chip oscillator circuitry is more susceptible to variations in temperature and power supply voltage. There have been various types of oscillator circuits developed that offer some degree of temperature and power supply independence. However, most require complex circuitry often relying on the temperature behavior of bipolar transistors. These types of circuits thus require an optimized bipolar process or a combination of bipolar and complementary metal-oxide-semiconductor (CMOS) process.

There is a need for a cost-effective oscillator circuit that generates a well controlled and stable reference frequency that is insensitive to temperature and power supply variations.

SUMMARY OF THE INVENTION

The present invention provides a fully integrated, temperature and supply independent oscillator circuit that provides a stable and accurate reference frequency. Broadly, the circuit of the present invention uses a relaxation type oscillator that operates by supplying a charge current to a capacitor that is charged and discharged based on the level of a threshold voltage. The invention further includes circuitry that generates the charge current and the threshold voltage such that the temperature dependent parameters in the charging current substantially cancel those in the threshold voltage, thereby yielding a substantially temperature independent output frequency. In one embodiment, the oscillator circuit is made digitally programmable so it can generate different frequencies required for different circuit applications. The oscillator circuit of the present invention can be implemented using conventional CMOS technology.

Accordingly, in one embodiment, the present invention provides an oscillator circuit including a relaxation oscillator having a current input adapted to receive a charge current, a voltage input adapted to receive a threshold voltage, and a frequency output, a current generating circuit having an output coupled to the current input of the relaxation oscillator, and a voltage generating circuit having an output coupled to the voltage input of the relaxation oscillator, wherein the current generating circuit and the voltage generating circuit are configured to generate a charge current and a threshold voltage such that their temperature dependent parameters substantially cancel to yield a substantially temperature independent output frequency.

In another embodiment, the present invention provides a voltage controlled oscillator including a reference circuit having a reference voltage output and a reference current output, a resistor circuit coupled to receive the reference current and configured to generate a voltage output, a voltage to current converter coupled to receive the voltage output of the resistor circuit and configured to generate a current output in response thereto, a gain and buffer circuit coupled to receive the reference voltage output and configured to generate a threshold voltage, and a relaxation oscillator having a current input coupled to the current output of the voltage to current converter, and a voltage input coupled to receive the threshold voltage. The gain and buffer circuit is designed such that the threshold voltage substantially replicates temperature-dependent parameters in the current output of the voltage to current converter, resulting in an output frequency that is substantially temperature independent.

The following detailed description and the accompanying drawings provide a better understanding of the nature and advantages of the voltage controlled oscillator according to the present invention.

DESCRIPTION OF THE SPECIFIC EMBODIMENTS

Figure 1:
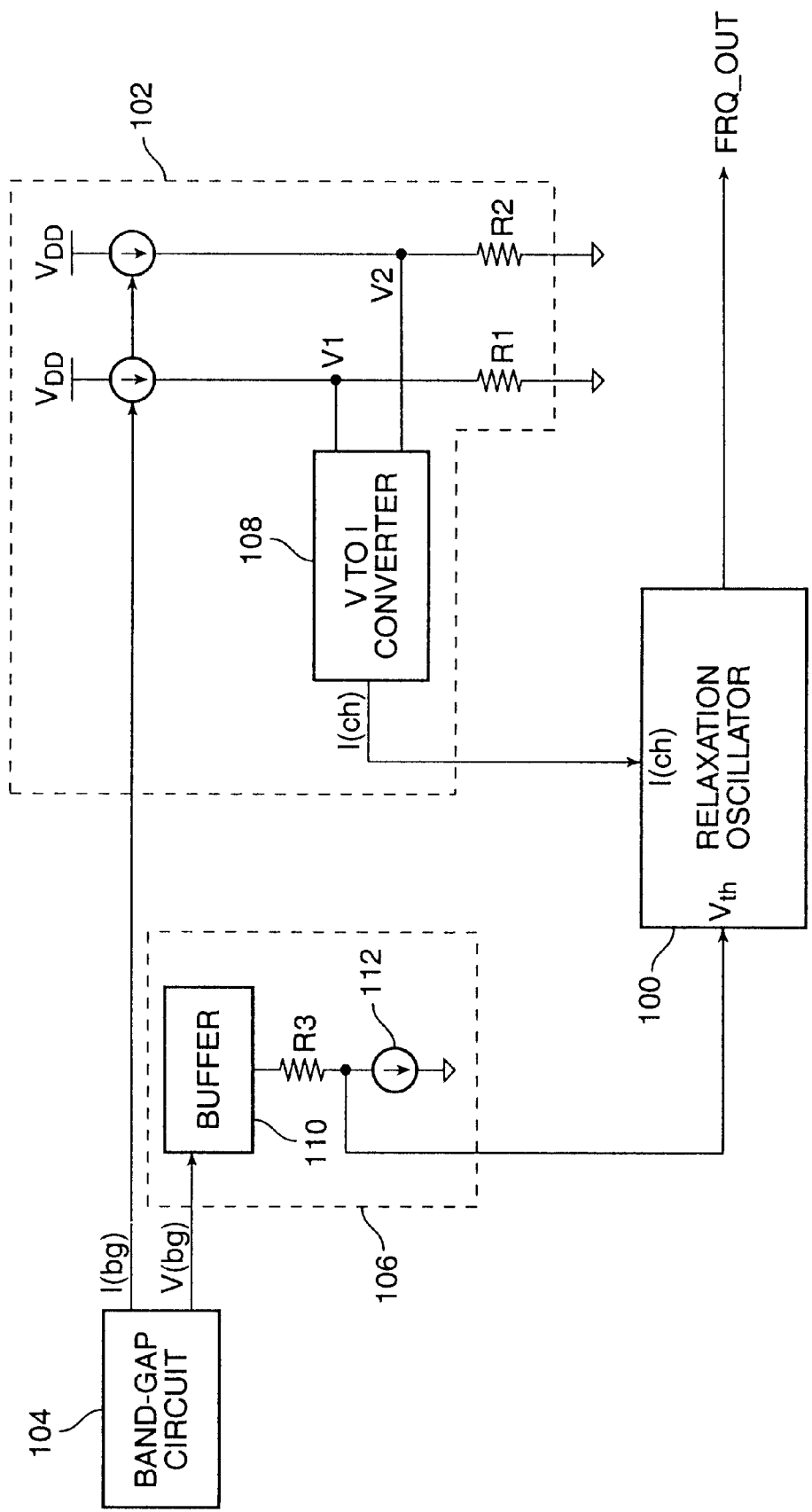
FIG. 1 is a simplified block diagram of the oscillator circuit according to the present invention.

Referring to FIG. 1, there is shown a simplified block diagram of the oscillator circuit according to one embodiment of the present invention. The oscillator circuit includes a relaxation oscillator 100 that has a charge current I(ch) input, a threshold voltage Vth input and a frequency output FRQ_OUT. The VCO further includes a current generating circuit 102 that receives a current output I(bg) of a band-gap circuit 104 and generates a current output I(ch) for the charge current input of relaxation oscillator 100. A voltage generating circuit 106 receives a voltage output V(bg) of band-gap circuit 104 and generates a voltage Vth for the threshold voltage input of relaxation oscillator 100. The band-gap voltage output V(bg) is substantially power supply and temperature independent, while its current output I(bg) varies with temperature. With the output frequency (FRQ_OUT) of relaxation oscillator 100 being proportional to the ratio I(ch)/Vth, current and voltage generating circuits 102 and 106 are designed such that the temperature dependent parameters in the I(ch) expression substantially equal, and therefore cancel, the temperature dependent parameters in the Vth expression. By thus canceling the temperature dependent parameters from the expression defining output frequency FRQ_OUT, the oscillator circuit of the present invention generates a highly stable and temperature insensitive reference frequency.

In the embodiment shown, the desired relationship between I(ch) and Vth is realized by carefully selecting the values of resistors R1 and R2 in current generating circuit 102 that produce temperature dependent voltage inputs V1(t) and V2(t) for a voltage to current converter 108. A buffer 110, resistor R3 and current source 112 in voltage generating circuit 106 are then designed with mirrored currents and tracking transistors to generate the desired Vth value. The operation of the present invention will be described in greater detail with reference to an exemplary CMOS circuit implementation shown in FIG. 2.

Figure 2:
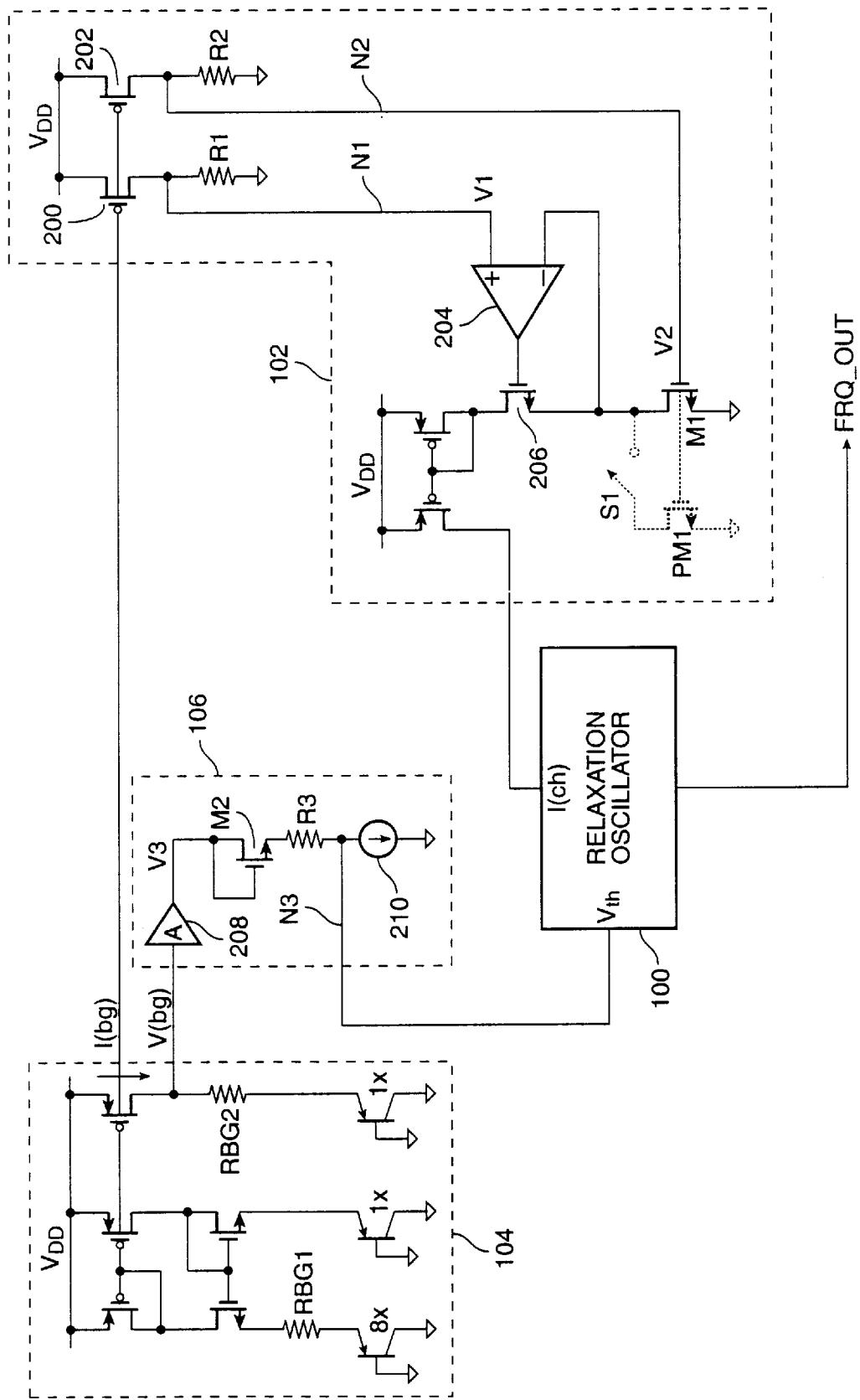
FIG. 2 shows an exemplary circuit implementation of the oscillator circuit of the present invention.

Referring to FIG. 2, internal circuitry for the various blocks of FIG. 1 is shown according to an exemplary embodiment of the present invention. Band-gap reference circuit 104, implemented in CMOS technology, uses PNP transistors that are found inherent in conventional CMOS processes. Temperature dependent current output I(bg) of band-gap circuit 104 is mirrored by transistors 200 and 202 and flows through resistors R1 and R2. This generates temperature dependent voltages V1=I(bg)×R1 and V2=I(ch)×R2 at nodes N1 and N2, respectively. Voltage V1 is applied to one input of an operational amplifier 204, and voltage V2 is applied to the gate terminal of an n-channel field effect transistor M1. Operational amplifier 204 is configured as a source follower having its negative input coupled to the source terminal of transistor 206 (and drain of M1), and its output connected to the gate of transistor 206. The current I(M1) through transistors 206 and M1 is mirrored and applied to the I(ch) input of relaxation oscillator 100.

Band-gap circuit 100 also generates a very stable temperature independent output voltage V(bg) that is applied to circuit 106. Voltage generating circuit 106 includes an amplifier 208 that amplifies the level of V(bg) and generates voltage V3 at its output. The signal V3 is applied to an n-channel diode-connected filed effect transistor M2 followed by resistor R3 and current source 210. Current source 210 is designed to draw an amount of current substantially equal to I(bg). The current through R3 sets up the threshold voltage Vth at node N3 that connects to the threshold voltage input Vth of relaxation oscillator 100.

Figure 3:
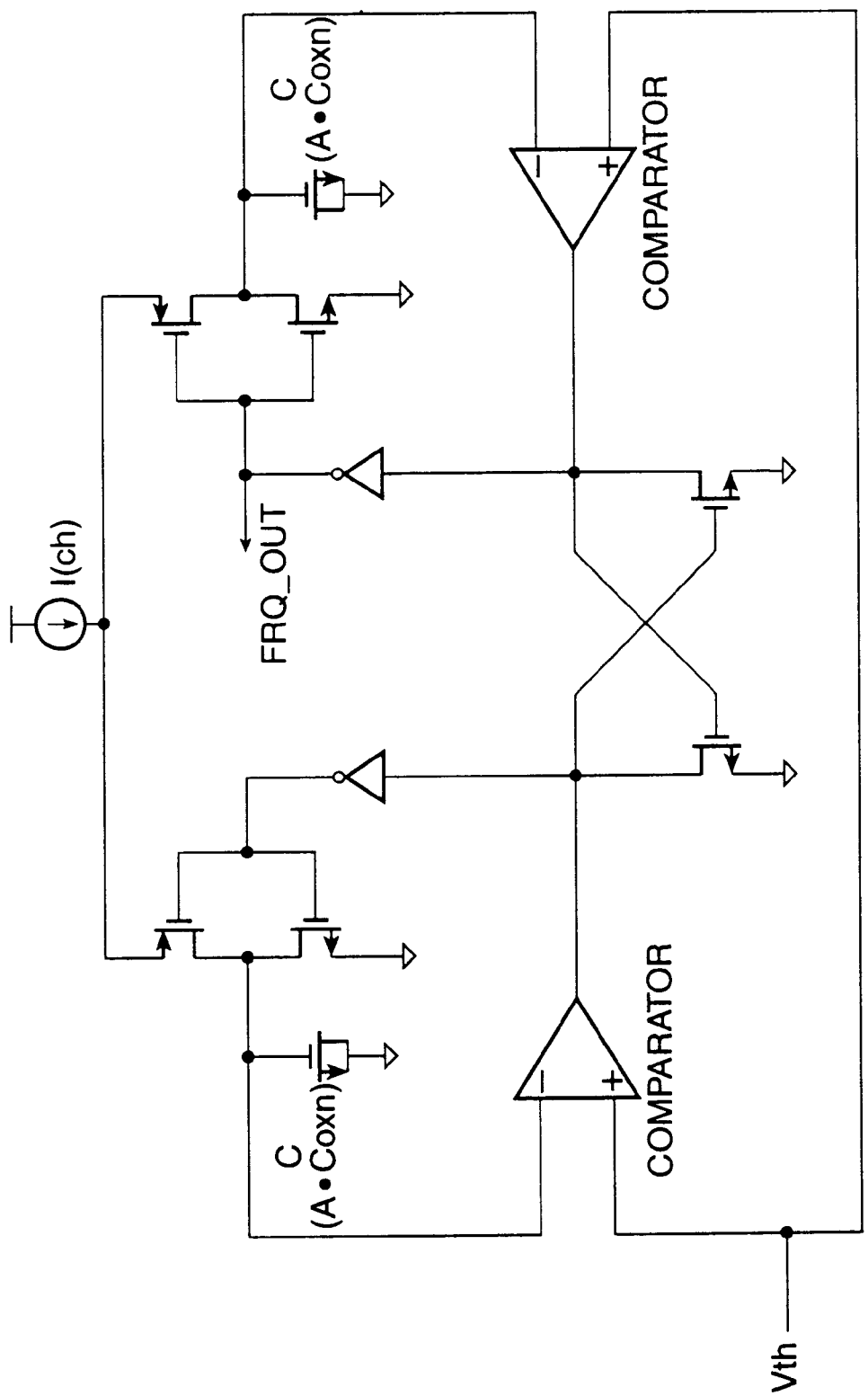
FIG. 3 shows a circuit example of a relaxation oscillator for use in the oscillator of FIG. 2.

In operation, the oscillation frequency FRQ_OUT of relaxation oscillator 100 is determined by the value of charge current I(ch), threshold voltage Vth and an internal capacitance. FIG. 3 shows one example of a relaxation oscillator for use in the oscillator circuit of the present invention. As the operation of the relaxation oscillator is well understood, a detailed description of the circuit and its operation is not provided. Current I(ch) charges and discharges timing capacitors C (implemented by source-drain connected NMOS transistors), in response to the comparator outputs that toggle with Vth as the trip point. This results in an oscillating signal at the output. The frequency of oscillation of the output signal is thus given by the expression:

$$FRQ\_OUT = I(ch)/(2*A*Coxn*Vth) \qquad (1)$$

Where: A=Area of each timing capacitor C, and

Coxn=unit capacitance of NMOS gate capacitance.

In order to realize a temperature and supply independent FRQ_OUT, I(ch), Coxn, and Vth are designed, according to the present invention, such that their temperature variations substantially cancel each other while each parameter maintains insensitivity to power supply variations. Referring back to FIG. 1, the current output I(bg) of band-gap circuit 100 depends on the base-emitter voltage of the bipolar transistors and the value of RBG1, and is thus directly proportional to absolute temperature (PTAT). Two temperature dependent voltages V1 and V2 are generated by mirroring current I(bg) through resistors R2 and R3, respectively. The voltages V1 and V2 are give by:

$$V1 = (R2/RBG1)*\ln 8 * VT; \qquad (2)$$

$$V2 = (R3/RBG1)*\ln 8 * VT \qquad (3)$$

Where, VT is the thermal voltage (constant) and the natural log of 8 (or ln8) is the result of the size ratio of the bipolar transistors in band-gap circuit 100. The particular ratio of 8:1 for the band-gap bipolar device is arbitrary and is used herein as an example for illustrative purposes only. Note that V1 and V2 are dependent upon temperature and ratio of resistors only, and that they are not dependent upon absolute resistor values. These two voltages are designed to bias transistor M1 into its linear region of operation. Voltage V2 is connected to the gate terminal of transistor M1, while V1 is coupled (via source follower 204/206) to the drain terminal of transistor M1. By selecting proper values for resistors R2 and R3, the value of V1 can be made smaller than (V2−Vtn), where Vtn is the threshold voltage of transistor M1. The relation V1<(V2−Vtn) ensures the operation of transistor M1 in linear region. The current I(M1) flowing through a linearly operating transistor M1 can thus be given by the following equation:

$$I(M1) = \mu n \times Coxn \times (W/L)m1 \times [V2 - Vtn - (\tfrac{1}{2}) \times V1] \times V1 \qquad (4)$$

Where: μn=mobility of NMOS transistor,

Coxn=unit capacitance of NMOS gate capacitance, and (W/L)m1=ratio of channel width to length for M1.

This current is mirrored and supplied to the current input I(ch) of relaxation oscillator 100.

Referring back to FIG. 2, band-gap voltage output V(bg) generates voltage V3 by passing through a gain amplifier 208. V3 is connected to a preferably large diode-connected NMOS transistor M2 and resistor R3 in series, with the series combination biased by current source 210. The value of R3 is set to one half of R2 (i.e., R3=½R2), and the magnitude of current through 210 is set to equal I(bg). Thus, assuming M2 is large enough such that its gate-to-source voltage Vgs(m2) is very close to its threshold voltage Vtn at the drain current level of I(bg), this circuit produces a voltage Vth at node 3 that is given by:

$$Vth = V3 - Vtn - (\tfrac{1}{2}) \times V1 \qquad (5)$$

Note that equation (5) defining the threshold voltage Vth for the relaxation oscillator is similar to the bracketed portion of equation (4) defining the relaxation oscillator charge current I(ch). Combining equations (2), (4) and (5) into equation (1), results in the following expression for FRQ_OUT:

$$FRQ\_OUT = \{\mu n \times Coxn \times (W/L)m1 \times [V2 - Vtn - (\tfrac{1}{2}) \times V1] \times V1\} / \{2A \times Coxn \times [V3 - Vtn - (\tfrac{1}{2}) \times V1]\}$$

Simplifying the above equation yields:

$$FRQ\_OUT = \{\mu n \times (W/L)m1 \times [V2 - Vtn - (\tfrac{1}{2}) \times V1] \times V1\} / \{2A \times [V3 - Vtn - (\tfrac{1}{2}) \times V1]\} \qquad (6)$$

Thus, by setting V2 and V3 to an equal voltage, and assuming a well-tracking n-channel threshold voltage Vtn for transistors M1 and M2 that are preferably identical in size, equation (6) above can be further simplified to:

$$FRQ\_OUT = [\mu n \times (W/L)m1 \times V1]/2A \qquad (7)$$

In the resulting expression for FRQ_OUT, most temperature dependent parameters are thus canceled. A more thorough temperature analysis of this equation reveals the advantages of the present invention. Since V1 shown in equation (2) above is directly proportional to absolute temperature (PTAT), it can compensate a first order dependence of mobility on $T^{-1}$. However mobility is almost a second order function of temperature, as shown below:

$$\mu n(T) = \mu o \times (T/To)^{(-n)} \text{ where, } 1.5 < n < 2. \qquad (8)$$

Considering that V2 and V1 are both PTAT and V3 is temperature insensitive, and performing a partial derivative of the equation (6) defining FRQ_OUT with respect to absolute temperature, shows the overall temperature dependence of the output frequency. Since V3 is a multiple of the band-gap output voltage V(bg), d(V3)/dT=0. Therefore:

$$(1/FRQ\_OUT)[d(FRQ\_OUT)/dT] = \\ (1-n) \times (T^{-1}) + [V2 \times (T^{-1})]/[V2 - Vtn - (1/2) \times V1] - \\ [Vtn \times k + (V1/2T)] \times \{(V3 - V2)/[V2 - Vtn - 1/2 \times V1] \times \\ (V3 - Vtn - 1/2 \times V1)]\} \quad (9)$$

where, k is the temperature coefficient of Vtn.

Note that V1, V2 and V3 can be adjusted to exactly compensate the mobility variation for a given temperature. It can be shown that for a temperature range from, for example, −20 C. to 150 C., the maximum frequency change of FRQ_OUT for the circuit of FIG. 2 is about ±2.5%. This exemplary number represents 294PPM/C in average, and is sustained at all process corners. It can also be shown that a temperature coefficient of zero may be obtained around 60 to 100 C. for the circuit of FIG. 2.

In one embodiment, the present invention allows for the output frequency FRQ_OUT to be digitally programmable. As explained above, transistor M1 operates in linear mode, and sets the magnitude of charge current I(ch) for relaxation oscillator 100. Referring back to equation (7) which defines the value of FRQ_OUT, it can be seen that FRQ_OUT can be linearly scaled by adjusting the size (W/L) of transistor M1. This can be accomplished by connecting one or more transistors in parallel to transistor M1 via digitally programmable switches. FIG. 2 shows (in phantom) one programmable transistor PM1 that is connected in parallel to transistor M1 via a programmable switch S1. By closing switch S1, transistor PM1 is connected in parallel to transistor M1, and the combined transistors have an increased W/L ratio, causing an increase in I(M1) and I(ch). This in turn increases the frequency of FRQ_OUT. Thus, the linear scaling of the size of transistor M1 allows the VCO of the present invention to be used in telecommunication applications requiring different acquisition frequencies. For example, the VCO frequency can be switched to the reference frequency required by T3, or E3 or STS1.

In conclusion, the present invention provides an oscillator circuit that generates a temperature and supply independent output frequency. The highly stable oscillator circuit can be fabricated using conventional CMOS technology, and does not rely on optimized bipolar technology. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. An oscillator circuit comprising:
   a relaxation oscillator having a current input adapted to receive a charge current, a voltage input adapted to receive a threshold voltage, and a frequency output;
   a current generating circuit having an output coupled to the current input of the relaxation oscillator; and
   a voltage generating circuit having an output coupled to the voltage input of the relaxation oscillator,
   wherein, the current generating circuit and the voltage generating circuit are configured to generate a charge current and a threshold voltage such that their temperature dependent parameters substantially cancel to yield a substantially temperature in dependent output frequency.

2. The oscillator circuit of claim 1 further comprising a band-gap reference circuit having a reference current output coupled to the current generating circuit, and a reference voltage output coupled to the voltage generating circuit.

3. The oscillator circuit of claim 2 wherein the current generating circuit comprises a field effect transistor (FET) biased to operate in linear mode.

4. The oscillator circuit of claim 3 wherein the current generating circuit further comprises:
   a first resistor coupled to the reference current output, and configured to generate a first voltage; and
   a second resistor coupled to the reference current output, and configured to generate a second voltage,
   wherein, the first voltage is coupled to a drain terminal of the FET, and the second voltage is coupled to a gate terminal of the FET.

5. The oscillator circuit of claim 4 wherein the current generating circuit further comprises:
   a buffer coupled between the first voltage and the drain terminal of the FET; and
   a current mirror circuit coupled to the FET, and configured to mirror a drain current of the FET into the current input of the relaxation oscillator.

6. The oscillator of claim 5 wherein the voltage generating circuit comprises:
   an amplifier having an input coupled to the reference voltage output, and an output, wherein the amplifier is configured to generate a third voltage at its output;
   a third resistor coupled to receive the third voltage; and
   a current source coupled to the third resistor.

7. The oscillator circuit of claim 6 wherein the voltage generating circuit further comprises a diode-connected FET coupled in series with the third resistor and the current source, and
   wherein, the voltage input of the relaxation oscillator couples to the third resistor.

8. The oscillator circuit of claim 7 wherein the first and second resistors, and the current source are configured to respectively draw a current having substantially equal magnitude.

9. The oscillator circuit of claim 8 wherein the third resistor has a resistance value that is substantially equal to one half of a resistance value of the first resistor.

10. The oscillator circuit of claim 9 wherein the circuit is fabricated using conventional complementary metal-oxide-semiconductor technology.

11. The oscillator circuit of claim 3 wherein the FET comprises one fixed FET and one programmable FET coupled in parallel to the fixed FET via a switch.

12. An oscillator circuit comprising:
   a relaxation oscillator having a current input, a voltage input and a frequency output;
   a band-gap reference circuit having a temperature dependent reference current output and a substantially temperature independent reference voltage output;
   a current generating circuit coupled to the reference current output of the band-gap circuit, and having a field effect transistor (FET) biased in linear mode of operation, and a current output coupled to the current input of the relaxation oscillator; and
   a voltage generating circuit coupled to the reference voltage output of the band-gap circuit, wherein, the current generating circuit supplies to the current input of the relaxation oscillator, a charge current having a magnitude substantially proportional to a drain current of the FET operating in linear region.

13. The oscillator circuit of claim 12 wherein the current generating circuit further comprises:

a first resistor coupled to the reference current output and configured to generate a first voltage; and a second resistor coupled to the reference current output and configured to generate a second voltage, wherein, the first voltage couples to a drain terminal of the FET and the second voltage couples to a gate terminal of the FET.

14. The oscillator circuit of claim 13 wherein the voltage generating circuit comprises:

an amplifier having an input coupled to the reference voltage output, and an output;

a diode-connected FET coupled to the output of the amplifier;

a resistor coupled to the diode-connected FET; and a current source coupled to the resistor.

15. A method of generating a reference frequency comprising the steps of:

biasing a field effect transistor into a linear mode of operation to generate a drain current defined by a first set of temperature dependent parameters;

from a band-gap reference signal, generating a stable threshold voltage defined by a second set of temperature dependent parameters;

supplying a current having a magnitude defined by the drain current, to a current input of a relaxation oscillator;

supplying a voltage having a level defined by the stable threshold voltage, to a threshold voltage input of the relaxation oscillator; and adjusting a level of the stable voltage so that to the second set of temperature dependent parameters substantially equal the first set of temperature dependent parameters, whereby a substantially temperature independent frequency is generated by the relaxation oscillator.

* * * * *